(12) United States Patent
Ramesh et al.

(10) Patent No.: US 6,628,164 B2
(45) Date of Patent: Sep. 30, 2003

(54) METHOD AND APPARATUS FOR EXPONENTIAL GAIN VARIATIONS WITH A LINEARLY VARYING INPUT CODE

(75) Inventors: M. C. Ramesh, Dallas, TX (US); Feng Ying, Plano, TX (US); Haydar Bilhan, Dallas, TX (US); Gary Lee, Plano, TX (US); Yong Han, Plano, TX (US); Ching-Yuh Tsay, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/123,642

(22) Filed: Apr. 16, 2002

(65) Prior Publication Data

US 2002/0190788 A1 Dec. 19, 2002

Related U.S. Application Data

(60) Provisional application No. 60/293,085, filed on May 22, 2001.

(51) Int. Cl.$^7$ ............................................... H03F 1/02
(52) U.S. Cl. ........................... 330/9; 330/69; 330/109; 327/124
(58) Field of Search .............................. 330/9, 69, 109, 330/271; 327/124, 127, 137

(56) References Cited

U.S. PATENT DOCUMENTS 5,479,130 A * 12/1995 McCartney .................. 327/341
5,739,720 A * 4/1998 Lee .............................. 330/9

* cited by examiner

Primary Examiner—Henry Choe
(74) Attorney, Agent, or Firm—J. Dennis Moore; W. James Brady, III; Frederick J. Telecky, Jr.

(57) ABSTRACT

A programmable gain amplifier using metal-oxide-semiconductor (MOS) devices to approximate exponential gain characteristic with linear control signals is disclosed. According to one embodiment, the programmable gain amplifier (300a–300b) may include a capacitive switching circuit (304a–304b), a capacitive switching circuit (306a–306b), and an operational amplifier (302a–302b). Capacitive switching circuits (304a–304b and 306a–306b) may receive an analog input voltage through sample switches (308a–308b and 310a–310b). Capacitive switching circuit (304a–304b) receives an output from operational amplifier (302a–302b) through feedback switch (312a–312b). The programmable gain amplifier (300a–300b) may include a few additional unit capacitors which can allow larger gain ranges or more steps for a given range without a large increase in chip size.

20 Claims, 9 Drawing Sheets

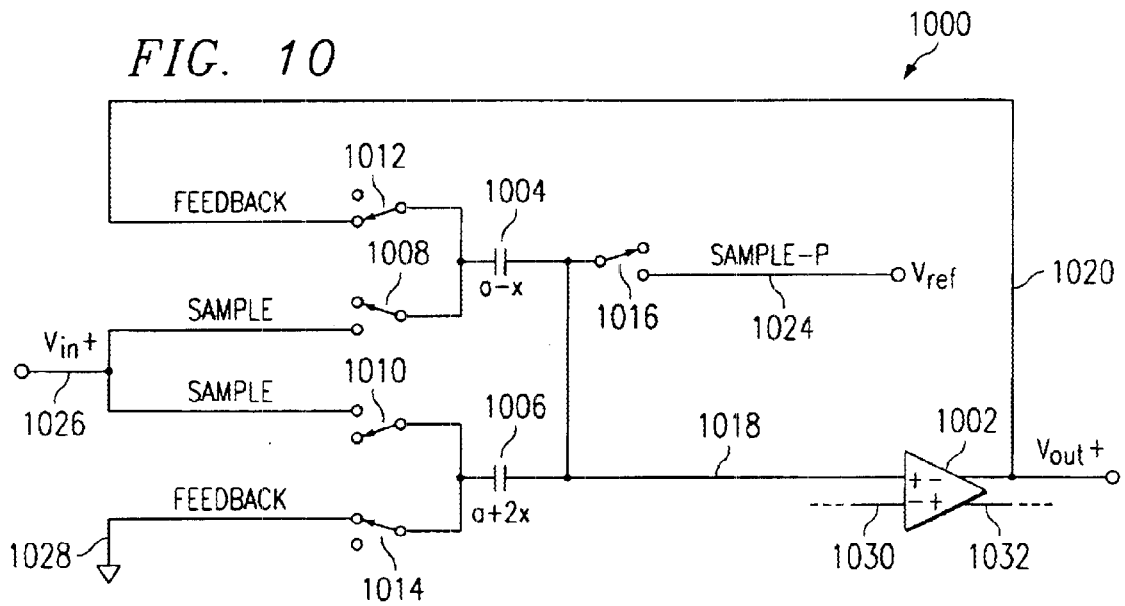
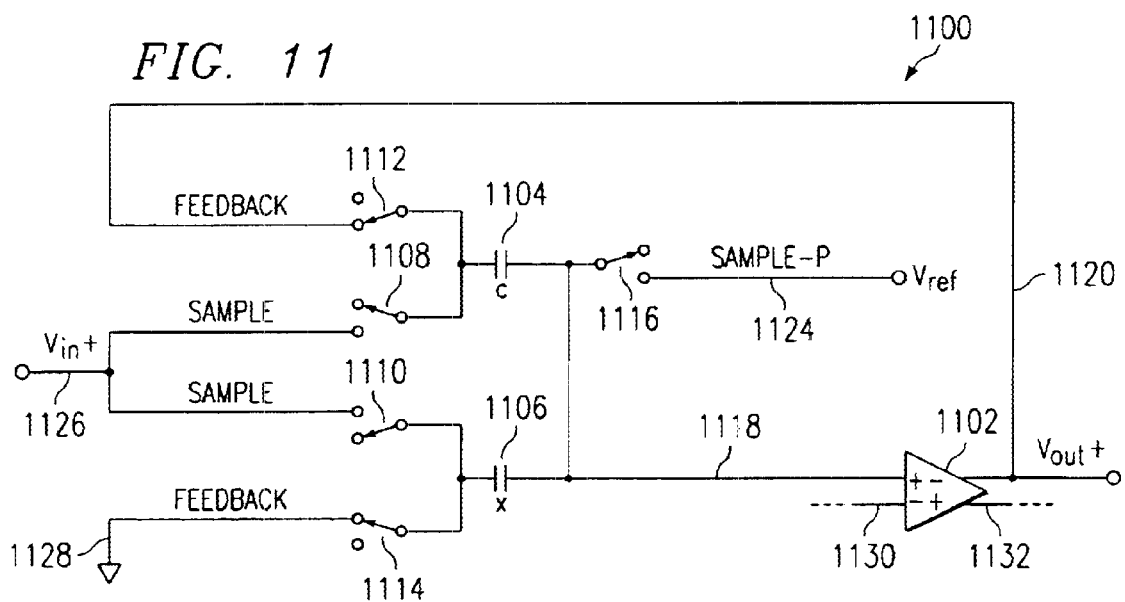

METHOD AND APPARATUS FOR EXPONENTIAL GAIN VARIATIONS WITH A LINEARLY VARYING INPUT CODE

This application claims priority under 35 USC §119(e)(1) of provisional application Serial No. 60/293,085, filed May 22, 2001.

TECHNICAL FIELD

The present invention relates generally to electronic circuits and, more particularly, to circuits having variable amplification of an input signal.

BACKGROUND OF THE INVENTION

In many signal processing applications there exists a need for providing exponential gain variations based on a linearly varying input control. Exponential gain variation implies that each increment in the control signal translates into a multiplication of the present gain value by a fixed quantity. Where this gain is controlled so as to vary based on a programmed input code or a control signal, the amplifier can be considered to a programmable gain amplifier.

One approach to providing exponential gain variation may take into account the exponential dependence of collector current on the base to emitter voltage of a bipolar junction transistor (BJT) device. That is, a BJT device may be used for gain control. One example of such an approach is shown in the publication, "Comlinear CLC520 Amplifier with Voltage Controlled Gain", National Semiconductor Corporation (NSC) Data Sheet, August 1996.

FIG. 1A shows exponential gain characteristics, as illustrated in the above referenced NSC data sheet. The graph of FIG. 1A includes a graph 120 that shows a gain versus the input voltage, Vg. The gain may be the ratio between an amplifier output voltage and the input voltage Vg. FIG. 1B shows these same characteristics, but with the gain measured in decibels (dB), which equals 20log(Vout/Vin). The Gain(dB) versus input voltage (Vg) curve is labeled 124.

While BJT gain control approaches, and the like, can provide exponential gain control, alternate approaches can provide a piecewise linear approximation to the exponential gain. Such approaches can include cascaded attenuators. An example of a conventional approximation approach is shown in "An Analog-to-Digital Processor for Camcorders and Digital Still Cameras", *IEEE Transactions on Consumer Electronics,* Vol. 44, No. 3, August 1998, by Mike Koen. In Koen, the relative gain versus a control voltage is as shown in FIG. 1C as curve 128. While Koen can provide an approximation of an exponential gain control, such an approach may be limited by noise requirements. It would be desirable to arrive at a more robust way of providing exponential gain control.

Still other approaches to approximating exponential linear gain control can include amplifier circuit that include switched capacitor networks. Accordingly, by way of further background, some basic principles of switched-capacitor networks will now be described. Typically, switched-capacitor networks can include metal-oxide-semiconductor (MOS) type switches. In MOS technology, it is relatively easy to implement switches, capacitors, and operational amplifiers (op amps). However, it can be difficult to construct resistors with the necessary accuracy. Consequently, switched-capacitor circuits can allow for a basic resistor approximation by using two MOS switches and a capacitor.

Extensive switched-capacitor networks, particularly those that employ the use of op amps and feedback circuitry, are well known in the art. Common applications include performing certain mathematical operations. For example, op amp circuits with switched-capacitor networks can implement signal summation, differentiation, programmable gain, and integration, to name only a few.

Programmable gain amplifiers can be implemented as a circuit using many different topologies, but with different degrees of relative success. For example, a programmable gain amplifier may have an open loop configuration, where there is no feedback network present. However, open loop topologies usually suffer from a compromise of signal range and linearity. As but one example, it is believed that achieving a signal gain which is linear to a 10-bit level for a one volt scale signal for any programmed gain, can be very difficult.

Closed loop, switched-capacitor programmable gain amplifiers, which include a feedback network present, are believed to provide better signal linearity than open loop approaches. Still further, in many cases switched-capacitor networks may be easily controlled by a digital interface. This can result in improved linearity of gain control (on a log scale) compared to other schemes.

Switched-capacitor circuits can handle large input signals that can be programmed over a wide range. However, the accuracy of a switched capacitor can often be dominated by capacitor matching. Thus, in many conventional approaches, in order to achieve exponential gains, exponentially varying capacitor sizes are used. Unfortunately, it can be difficult to design with exponentially varying capacitor sizes because of silicon area and power requirements.

A programmable gain amplifier that may include a switched-capacitor network of unit capacitors is shown in U.S. patent application Ser. No. 09/354,461, filed on Jul. 15, 1999 and titled "A Capacitor-Based Exponential Programmable Gain Amplifier" (referred to herein as Application 354,461).

In general, it can be possible to implement exponential gain variation with the approximation $\log_e (1+x)/(1-x) = \sim 2x$, where $|x| < 1$ is utilized. Here, x varies linearly and can correspond to the input gain setting code. A switched-capacitor stage of a programmable gain amplifier can implement a gain according relationship $(a+x)/(a-x)$, which can be seen to vary exponentially with x. Thus, for a switched-capacitor gain stage, the gain can be determined as the ratio of the number of unit capacitors used to sample an input to the number used for feedback. In the particular equation described above, a sampling capacitance can be represented by a gain numerator term $(a+x)$, while a feedback capacitance can be represented by a gain denominator term $(a-x)$. Accordingly, the number of unit capacitors used for sampling corresponds to $(a+x)$ and those used for feedback correspond to $(a-x)$.

In an approach such as Application 354,461, a sampling capacitance can be conceptualized as including $(a-x)$ and $2x$ capacitors, totalling $(a+x)$ capacitors. As is understood the feedback capacitance $(a-x)$ is included in the sampling capacitance term. Such a splitting of terms can enable implementation of the programmable gain amplifier with a reduced number of unit capacitors. One such implementation is shown schematically in FIG. 2A. It is understood that during the operation of a circuit, switching may result in the use of some unit capacitors and the non-use of others. Unused capacitors in any gain setting can be left connected to an op amp input node, and thereby serve to reduce the variation in the feedback-factor of the closed loop amplifier.

Referring again to FIG. 2A, a schematic diagram of a programmable gain amplifier according to the prior art will be described in more detail. The conventional programmable gain amplifier circuit is designated by the general reference character 200 and is shown to include an operational amplifier (op amp) 202, capacitive switching circuits (204 and 206), switches (208 and 210), feedback switch 212, switch 214, and a sample precharge switch 216.

The op amp 202 has a noninverting input connected to a charge summing node 218. The op amp 202 has an inverting input connected to node 230. The inverting output of the op amp 202 is connected to an analog output terminal 220, which is also labeled as Vout+, while the noninverting output of the op amp 202 is connected to an analog output terminal 232. Analog output node 220 is connected to the closed position input terminal of feedback switch 212.

The programmable gain amplifier receives an input signal Vin+ at analog input terminal 226. The analog input terminal 226 is connected to the closed position input terminals sample switches 208 and 210. A ground terminal 228 is connected to the closed position input terminal of switch 214. The output terminals of feedback switch 212 and sample switch 208 are connected to the input terminal of the capacitive switching circuit 204. The capacitive switching circuit 204 is a capacitor that has the value a−x. The output terminals of sample switch 210 and switch 214 are connected to the input terminal of capacitive switching circuit 206, the capacitive switching circuit 206 is a capacitor that has the value 2x. Terminals of the capacitive switching circuits 204 and 206 are connected to the charge summing node 218, which is also connected to the noninverting input of op amp 202 and to the output terminal of sample precharge switch 216.

A reference signal Vref is connected to the closed position input terminal of sample precharge switch 216. As is common in the art, only one half of the symmetric fully differential circuit is shown here for simplicity.

FIG. 2B shows the two phase non-overlapping clocking scheme that controls the switches in the circuit of FIG. 2A, as well as in the circuits to be discussed below. In FIG. 3A, the Sample waveform 270 rises coincident with Sample-P waveform 272, but Sample waveform 270 remains high longer than Sample-P waveform 272. Feedback waveform 274 is high only during the time period when both Sample waveform 270 and Sample-P waveform 272 are low.

Referring again to FIG. 2A in conjunction with FIG. 2B, the Feedback signal is coupled to feedback switch 212 and switch 214. When Feedback is high, feedback switch 212 and switch 214 connect their respective closed position input terminals to their respective output terminals. When Feedback is low, feedback switch 212 and switch 214 connect their respective open position input terminals to their respective output terminals. The Sample signal is coupled to sample switches 208 and 210. When Sample is high, sample switches 208 and 210 connect their respective closed position input terminals to their respective output terminals. When Sample is low, sample switches 208 and 210 connect their respective open position input terminals to their respective output terminals. The Sample-P signal is coupled to sample precharge switch 216. When Sample-P is high, the closed position input terminal is connected to the sample precharge switch 216 output terminal. When Sample-P is low, sample precharge switch 216 is configured in the open position, thus the open position input terminal of sample precharge switch 216 is connected to the sample precharge switch 216 output terminal.

By viewing FIG. 2A in conjunction with FIG. 2B, the circuit operation can be ascertained. When Sample and Sample-P are both high, during Phase 1, sample precharge switch 216 and sample switches (208 and 210) are all in their closed positions. Because feedback is low at this time, feedback switch 212 and switch 214 are in their open positions. As such, the input nodes of the capacitive switching circuits 204 and 206 are both charged to Vin+ while the charge summing node 218 is charged to Vref. Such a charging occurs over parallel sampling capacitances a−x and 2x, for a total sampling capacitance of a+x. This capacitance can correspond to a numerator term of a programmable gain.

When Feedback is high, during Phase 2, feedback switch 212 and switch 214 are in their closed positions, while all other switches are in their open positions. This is the state of all switches as actually illustrated in FIG. 2A. During Phase 2, the Vout+ level is connected through feedback switch 212 and to the input node of the capacitive switching circuit 204. Also during Phase 2, the input node of the capacitive switching circuit 206 is connected to ground terminal 228 through switch 214. A feedback voltage may thus be applied to non-inverting input by way of feedback capacitance a−x. This capacitance can correspond to a denominator term of a programmable gain. The total number of capacitors required is the sum of "a" and the maximum number of steps ($x_{max}$). For a particular gain setting "$x_1$", there exist $(a+x_{max})-(a+x_1)=(x_{max}-x_1)$ capacitors that can be unused for the gain operation. These can be unused in both the sample and feedback phase and can be left connected to node 218 in both phases for the purpose of stabilization.

In review, during the Phase 1 sampling period, capacitive switching circuits 204 and 206 are connected to the input signal Vin+ through sample switches 208 and 210, respectively. The sum of their capacitance values, or a−x+2x=a+x, gives the numerator in the overall gain equation. During the Phase 2 feedback period, only capacitive switching circuit 204 is enabled to the actual feedback signal, Vout+, through feedback switch 212. As such, the denominator in the overall gain equation is given by the capacitance value of the capacitive switching circuit 204 (a−x). Thus, the overall gain equals (a+x)/(a−x). It is understood that x is a programmable value that may be applied to the programmable gain amplifier.

In this way, one conventional approach can arrive programmable gain stage with an exponential gain control by switching to a predetermined sample capacitance and then to a predetermined feedback capacitance for all programmed gain steps.

The topology considered above can include capacitor arrays that include only unit capacitors. It follows that as the number of possible gain steps (determined by value x) increases, the number of unit capacitors can increase correspondingly. However, while unit capacitors may provide for increased accuracy in arriving at sampling and feedback capacitance, such unit capacitors can require valuable area on an integrated circuit device. Further, a larger number of capacitors can translate into more stores charge, and hence greater power consumption. Thus, larger numbers of unit capacitors can work against the common goal of smaller, lower power devices.

One approach to providing a programmable amplifier with gain steps that may require fewer capacitors can be to include an array of switchable weighted capacitors. Weighted capacitors may be weighted in a binary, exponential, or some other fashion. In such an approach, weighted capacitors may be switched to arrive at a desired sample and feedback capacitance. However, as noted above, gain accuracy can be reduced due to the difficulty in matching between the capacitors of different sizes.

In light of the above discussion, it would be desirable to arrive at some way of providing a programmable gain amplifier that may include a given number of gain steps, but include fewer capacitors than conventional approaches.

It would also be desirable to arrive at some way of providing a programmable gain amplifier that may approximate and an ideal exponential response over a wider range of gain values than conventional approaches.

SUMMARY OF THE INVENTION

According to the present embodiments, a programmable gain amplifier may include metal-oxide-semiconductor (MOS) transistors for approximating exponential gain characteristics with linear control signals. The programmable gain amplifier may include capacitive switching circuits in which a unit or fractional unit capacitor may be added. By using an additional unit or fractional unit capacitor, a gain approximation can be used which can allow an achievable gain range in which more steps may be implemented, thus allowing finer gain programmability.

According to one aspect of the embodiments, a few additional unit capacitors can allow larger gain ranges or more steps for a given range without a large increase in chip size.

According to one aspect of the embodiments, the programmable gain amplifier may provide gain steps that are divided into two or more groups. One group of steps may be governed by one gain equation while another group of steps may be governed by another, different gain equation.

According to one aspect of the embodiments, the gain of the programmable gain amplifier is determined by the capacitance of capacitive switching circuits.

According to another aspect of the embodiments, one of the capacitive switching circuits may have a first approximate capacitance value one group of steps and a second approximate value greater than the first approximate capacitance value for another group of steps.

According to another aspect of the embodiments, the programmable gain amplifier includes a sampling switch that may charge a capacitive switching circuit according to the voltage on an analog input terminal. A feedback switch may charge the capacitive switching circuit according to the voltage on an analog output terminal of a differential amplifier.

According to another aspect of the embodiments, the programmable gain amplifier includes a switch coupled to charge a capacitive switching circuit to a reference level.

According to another aspect of the embodiments, capacitive switching circuit capacitance can be obtained from an array of programmable capacitors.

According to another aspect of the embodiments, in a group of gain steps, a capacitive switching circuit may have a capacitance of approximately (a+x), where "a" can be a predetermined capacitance value and "x" can be a programmable capacitance value determined by the gain step.

According to another aspect of the embodiments, a capacitive switching circuit may have an approximate value of 2x plus the value of a programmable unit capacitor, where "x" can be a programmable capacitance value determined by the gain step.

According to another aspect of the embodiments, a capacitive switching circuit has an approximate value of (a−x) and another capacitive switching circuit has an approximate value of (a+2x), where "a" can be a predetermined capacitance value and "x" can be a programmable capacitance value determined by the gain step.

According to another aspect of the embodiments, the programmable gain amplifier includes an array of programmable capacitors. The programmable capacitors have essentially the same sized unit capacitors and may include at least one fractional capacitor having a value that is a fraction of a unit capacitor.

According to another aspect of the embodiments, at least one capacitor not used in a capacitor switching circuit is coupled to a charge summing node and a reference voltage.

BRIEF DESCRIPTION OF THE DRAWINGS

The foregoing aspects and advantages of various embodiments will become more readily appreciated by reference to the following detailed description, when taken in conjunction with the accompanying drawings listed below.

FIG. 10 is a simplified schematic diagram illustrative of a programmable gain amplifier implementing the function (2a+x)/(a−x).

FIG. 11 is a simplified schematic diagram illustrative of a programmable gain amplifier implementing the function 1+(x/c).

DETAILED DESCRIPTION OF THE EMBODIMENTS

Various embodiments may provide for approximate exponential gain variation with fewer capacitors and/or added accuracy over a given range of gain values by including switching circuits that may provide one sampling and/or feedback capacitance for certain gain steps while providing a different sampling and/or feedback capacitance for other gain steps.

According to one particular embodiment, a programmable gain amplifier that approximates exponential gain variation may include alternating first and second gain steps. For first gain steps, a first sampling capacitance and first feedback capacitance can be used. For second gain steps, a second sampling capacitance and second feedback capacitance can be used.

Such an embodiment may be best understood by example. It will first be assumed that it is desirable to arrive at an exponential gain variation between 1 and 2, in 64 steps of resolution. Each step may be 0.09 dB. Using the function (a+x)/(a−x)=2 where x=64, and solving for a (a=192), the number of unit capacitors in a conventional approach can be (a+x), or 256. Each unit capacitor is, of course, identically sized. It follows that to conventionally implement the same gain range in 128 steps with an associated step size of 0.045 dB would require the use of 512 unit capacitors.

However, according to embodiments of the present invention, with the addition of just two half-unit capacitors to the 256 unit capacitors, the gain range of 1 to 2 can be spanned in 128 steps. This is illustrated by considering (a+x)/(a−x), where x=0,1, . . . 63 as (a+x/2)/(a−x/2), where x=0,1, . . . 127, which allows for 128 steps, with odd values of "x" using the half size capacitors.

Figure 3A:
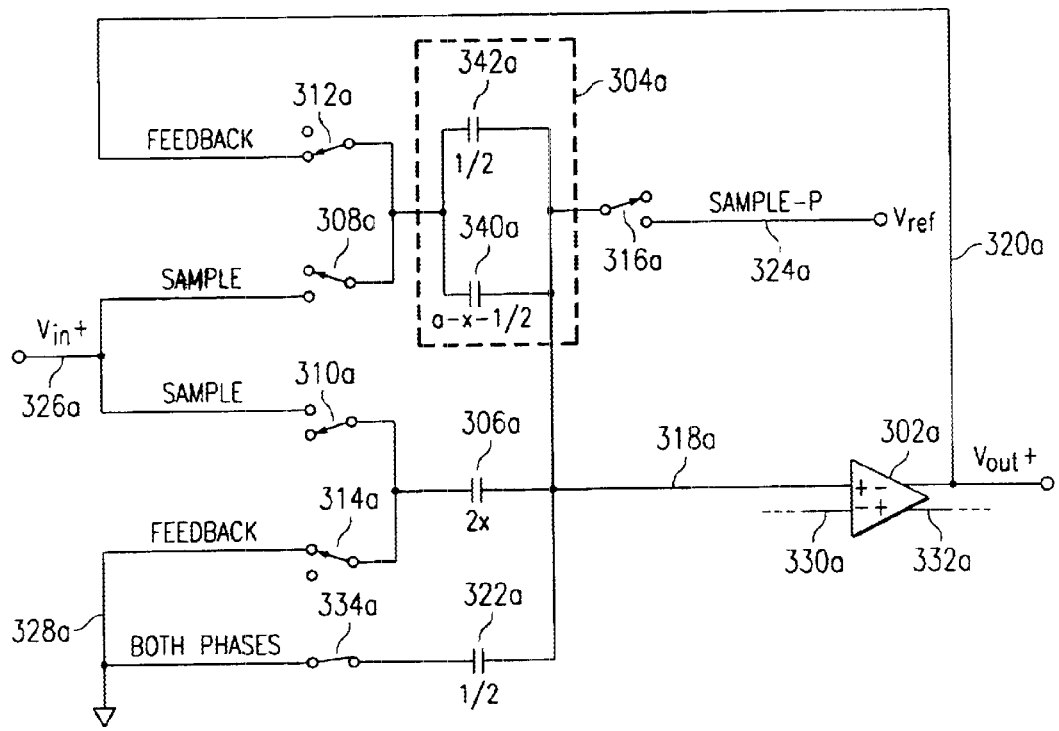
FIG. 3A is a simplified schematic diagram illustrative of a programmable gain amplifier with half the step size, during even steps.
Figure 3B:
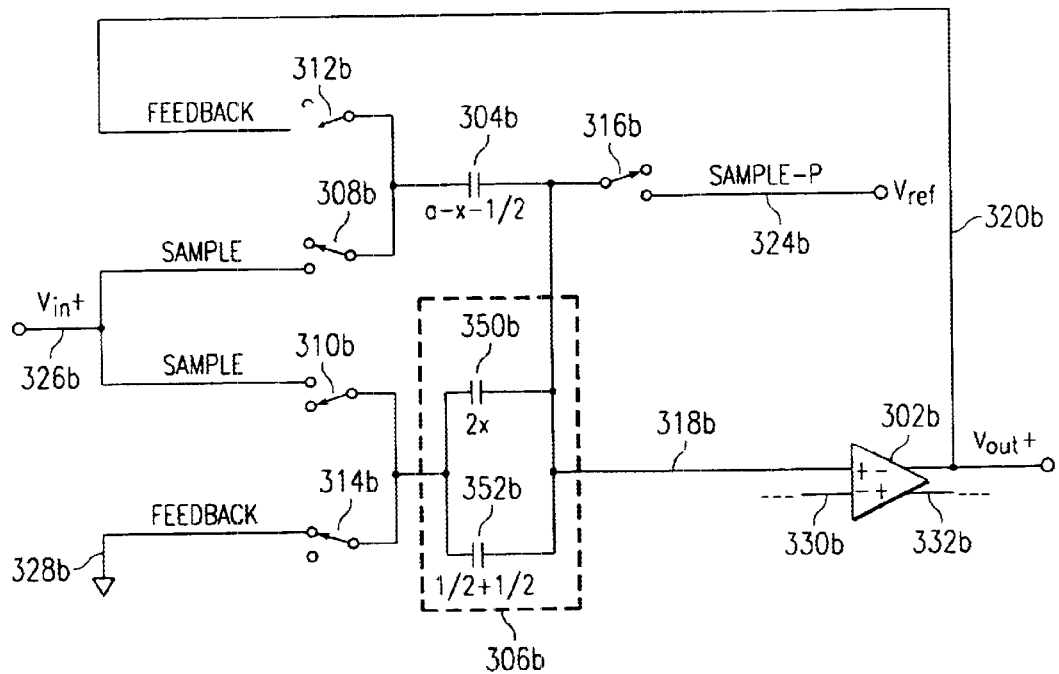
FIG. 3B is a simplified schematic diagram illustrative of a programmable gain amplifier with half the step size, during odd steps.

A simplified schematic of an implementation of this scheme is shown in FIG. 3A for the even steps and FIG. 3B for the odd steps. Table 1 shows the gain equations that may be used for this example. The 2nd column illustrates how in a conventional (old) case x=0-127 to arrive at 128 gain steps while using 512 capacitors. The 2nd column also illustrates how the same gain ratio can be used for all gain steps. In contrast, the 3rd column illustrates how 128 gain steps may be achieved, while using 128 unit capacitors and two half-unit capacitors, thereby reducing overall capacitor numbers. The right columns also show how on particular gain steps (e.g., even steps) one grain ratio may be used, while on other gain steps (e.g., odd steps) a different gain ratio may be used.

TABLE 1

| Step | Ratio-old | Ratio-new |
|---|---|---|
| 0 | (a + x)/(a − x) | (a + x)/(a − x) |
| 1 | (a + x)/(a − x) | (a + x + ½)/(a − x − ½) |
| 2 | (a + x)/(a − x) | (a + x)/(a − x) |
| 3 | (a + x)/(a − x) | (a + x + ½)/(a − x − ½) |
| . . . | . . . | . . . |
| 124 | (a + x)/(a − x) | (a + x)/(a − x) |
| 125 | (a + x)/(a − x) | (a + x + ½)/(a − x − ½) |
| 126 | (a + x)/(a − x) | (a + x)/(a − x) |
| 127 | (a + x)/(a − x) | (a + x + ½)/(a − x − ½) |

It follows from the above table and dicussion that the gain steps can further be doubled by the use of just two additional one-fourth unit capacitors.

Referring now to FIG. 3A, a schematic diagram of a programmable gain amplifier according to the present invention is set forth. The programmable gain amplifier can include similar constituents as the conventional case set forth in FIG. 2A. To that extent, like constituents will be referred to by the same reference character, but with the first digit being a "3" instead of "2" and ending with an "a."

The programmable gain amplifier circuit of FIG. 3A is designated by the general reference character 300a and is shown to may include an operational amplifier (op amp) 302a, capacitive switching circuits (304a, and 306a), sample switches (308a and 310a), feedback switch 312a, switch 314a, and a sample precharge switch 316a.

An op amp 302a may have a noninverting input connected to a charge summing node 318a. The op amp 302a may have an inverting input connected to node 330a. The inverting output of the op amp 302a can be connected to an analog output terminal 320a which is also labeled as Vout+. The non-inverting output of the op amp 302a can be connected to an analog output terminal 332a. Analog output node 320a may be connected to the closed position input terminal of feedback switch 312a.

The programmable gain amplifier may receive an input signal Vin+ at analog input terminal 326a. The first analog input terminal 326a may be connected to the closed position input terminals of sample switches 308a and 310a. A ground terminal 328a can be connected to the closed position input terminal of switch 314a. The output terminals of feedback switch 312a and sample switch 308a can be connected to the input terminal of the capacitive switching circuit 304a.

Figure 1A:
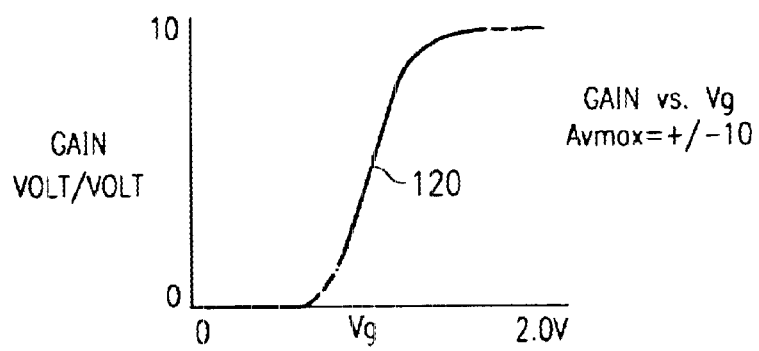
FIG. 1A is a diagram illustrative of exponential gain characteristics in terms of the ratio of the output voltage to the input voltage.
Figure 1B:
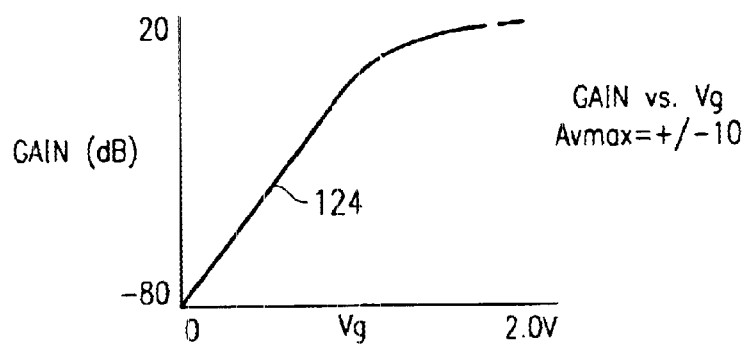
FIG. 1B is a diagram illustrative of exponential gain characteristics as expressed in decibels (dB).
Figure 1C:
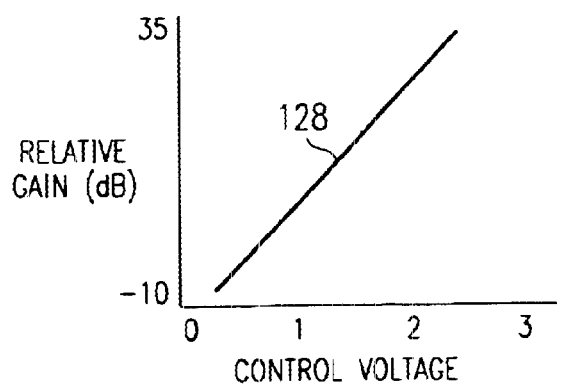
FIG. 1C is a diagram illustrative of attenuation versus the control voltage.
Figure 2A:
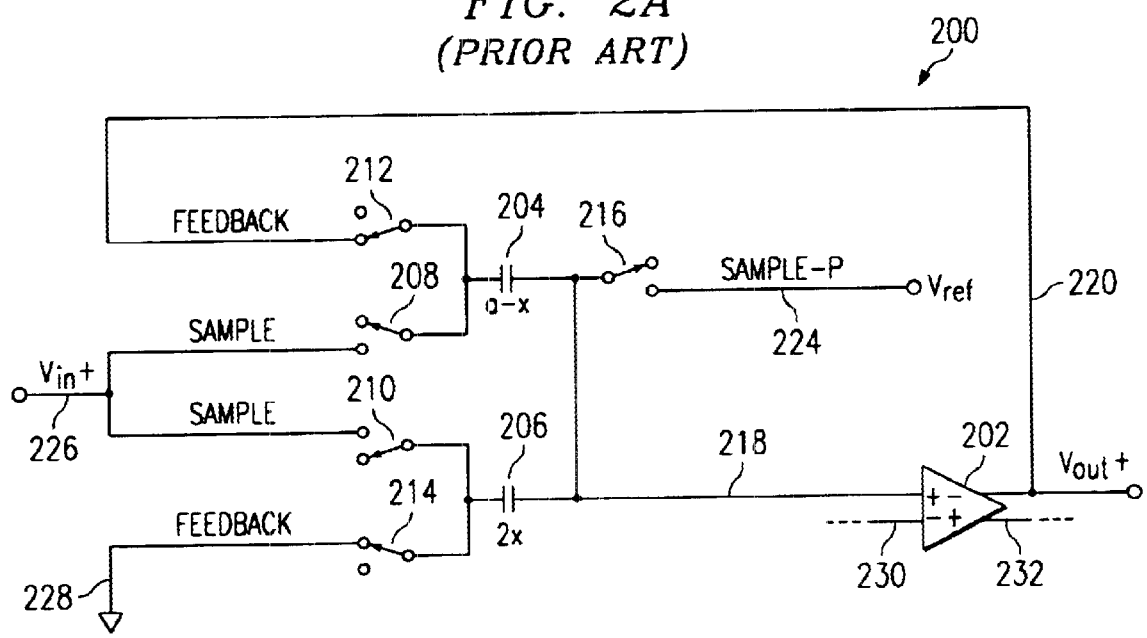
FIG. 2A is a simplified schematic diagram illustrative of a programmable gain amplifier common in the prior art.

Unlike the conventional programmable gain amplifier 200 of FIG. 2A, the capacitive switching circuit 304a of the programmable gain amplifier 300a in the embodiment of the invention set forth in FIG. 3A may be comprised of two capacitors, a capacitor circuit 340a that can have the value a−x−½ and a capacitor circuit 342a that can have the value of ½. The output terminals of sample switch 310a and switch 314a may be connected to the input terminal of capacitive switching circuit 306a, the capacitive switching circuit 306a may be a capacitor that has the value 2x.

A third capacitive switching circuit 322a can be included that has a capacitor with a value of ½. Third capacitive swithing circuit 322a may has an input connected to the ground terminal 328a through a switch 334a, which may be in the closed position.

The second terminals of capacitive switching circuits (304a, 306a, and 322a) can be connected to the charge summing node 318a, which can also connected to the noninverting input of op amp 302a and to the output terminal of sample precharge switch 316a.

A reference signal Vref can be connected to the closed position input terminal of sample precharge switch 316a. As is common in the art, only one half of the symmetric fully differential circuit is shown here for simplicity.

Figure 2B:
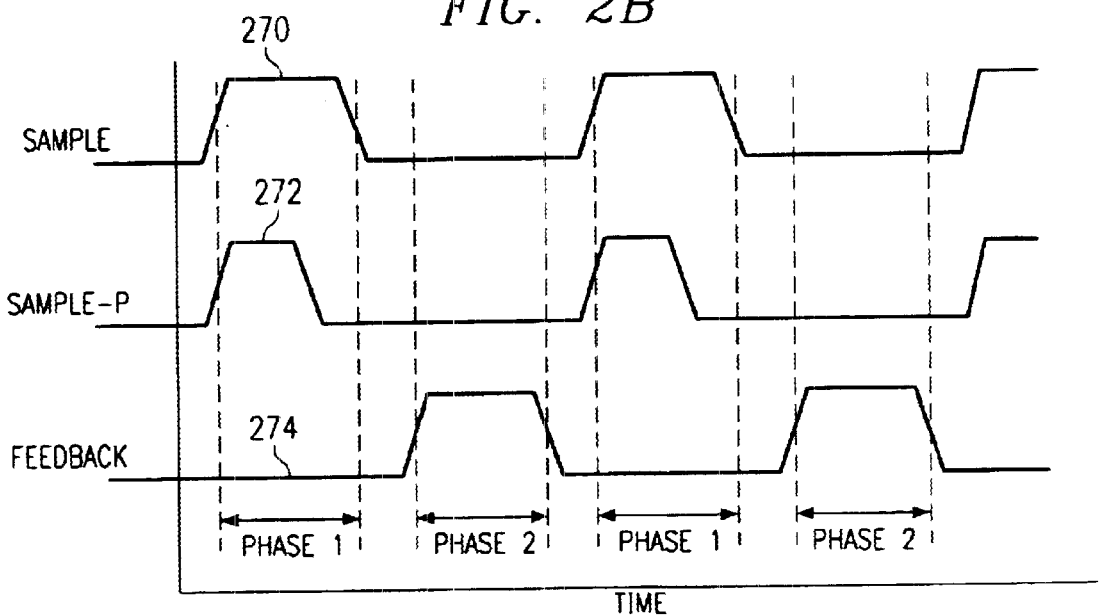
FIG. 2B is a timing diagram illustrative of the two phase non-overlapping clocking scheme employed in many of the circuits described herein.

An embodiment, such as that shown in FIGS. 3A and 3B may operate according to the same timing signals shown in FIG. 2B. The operation of the embodiment of FIGS. 3A and 3B will now be described with reference to FIG. 2B.

Referring to FIG. 3A in conjunction with FIG. 2B, the Feedback signal may be coupled to feedback switch 312a and switch 314a. When Feedback is high, feedback switch 312a and switch 314a may connect their respective closed position input terminals to their respective output terminals. When Feedback is low, feedback switch 312a and switch 314a may connect their respective open position input terminals to their respective output terminals. The Sample signal can be coupled to sample switches 308a and 310a. When Sample is high, sample switches 308a and 310a may connect their respective closed position input terminals to their respective output terminals. When Sample is low, sample switches 308a and 310a may connect their respective open position input terminals to their respective output terminals. The Sample-P signal can be coupled to sample precharge switch 316a. When Sample-P is high, the closed position input terminal can be connected to the sample precharge switch 316a output terminal. When Sample-P is low, sample precharge switch 316a can be configured in the open position, thus the open position input terminal of sample precharge switch 316a can be connected to the sample precharge switch 316a output terminal.

By viewing FIG. 3A in conjunction with FIG. 2B, the circuit operation can be ascertained. When Sample and Sample-P are both high, during Phase 1, sample precharge switch 316a and sample switches (308a and 310a) can be all in their closed positions. Since Feedback is low at this time, feedback switch 312a and switch 314a may be in their open positions. As such, the input nodes of the capacitive switching circuits 304a and 306a may both be charged to Vin+ while the charge summing node 318a may be charged to Vref.

When Feedback is high, during Phase 2, feedback switch 312a and switch 314a can be in their closed positions, while all other switches can be in their open positions. This can be representative of the state of all switches as actually illustrated in FIG. 2A. During Phase 2, the Vout+ level can be connected through feedback switch 312a and to the input node of the capacitive switching circuit 304a. Also during Phase 2, the input node of the capacitive switching circuit 306a can be connected to ground terminal 328a through switch 314a.

The above described sampling and feedback operations can determine amplifier gain. During the Phase 1 sampling period, capacitive switching circuits 304a and 306a can be connected to the input signal Vin+ through sample switches (308a and 310a), respectively. The sum of their capacitance values, or a−x−½+½+2x=a+x, may give the numerator in the overall gain equation. During the Phase 2 feedback period, capacitive switching circuit 304a may be enabled to the actual feedback signal, Vout+, through feedback switch 312a. As such, the denominator in the overall gain equation can be given by the capacitance value of the capacitive switching circuit 304a, which is a−x−½+½=a−x. Thus, the overall gain can equal (a+x)/(a−x).

While FIG. 3A can represent the operation of an embodiment during certain gain steps (e.g., even gain steps), an embodiment may have different sample and/or feedback capacitance values in other gain steps (e.g., odd gain steps). FIG. 3B shows the embodiment of FIG. 3A during other gain steps.

Referring now to FIG. 3B, a programmable gain amplifier during aaccording to the present invention can include similar constituents as the embodiment set forth in FIG. 3A. To that extent, like constituents will be referred to by the same reference character, but with the last digit being a "b" instead of an "a."

The programmable gain amplifier circuit of FIG. 3b is designated by the general reference character 300b and may include an operational amplifier (op amp) 302b, capacitive switching circuits (304b and 306b), sample switches (308b and 310b), feedback switch 312b, switch 314b, and a sample precharge switch 316b.

An op amp 302b can have a noninverting input connected to a charge summing node 318b. The op amp 302b can have an inverting input connected to node 330b. The inverting output of the op amp 302b can be connected to analog output terminal 320b, which can also be labeled as Vout+. Noninverting output of the op amp 302b can be connected to analog output terminal 332b. Analog output node 320b can be connected to the closed position input terminal of feedback switch 312b.

The programmable gain amplifier may receive an input signal Vin+ at analog input terminal 326b. The analog input terminal 326b can be connected to the closed position input terminals of sample switches 308b and 310b. A ground terminal 328b can be connected to the closed position input terminal of switch 314b. The output terminals of feedback switch 312b and sample switch 308b can be connected to the input terminal of the capacitive switching circuit 304b. The capacitive switching circuit 304b may have the value of a−x−½. It is noted that this may differ from the configuration of FIG. 3A which included an additional capacitor in parallel with a value of ½.

The output terminals of sample switch 310b and feedback switch 314b can be connected to the input terminal of capacitive switching circuit 306b. Unlike the conventional programmable gain amplifier 200 of FIG. 2A, the capacitive switching circuit 306b of the programmable gain amplifier 300b in the embodiment of the invention set forth in FIG. 3B can be comprised of two capacitors, capacitor circuit 350b that can have the value 2x and a second capacitor circuit 352b that may have the value of ½+½. The second terminals of capacitive switching circuits (304b and 306b) can be connected to the charge summing node 318b, which may also be connected to the noninverting input of op amp 302b and to the output terminal of sample precharge switch 316b.

A reference signal Vref can be connected to the closed position input terminal of sample precharge switch 316b. As is common in the art, only one half of the symmetric fully differential circuit is shown here for simplicity.

Referring again to FIG. 3B in conjunction with FIG. 2B, the Feedback signal may be coupled to feedback switch 312b and switch 314b. When Feedback is high, feedback switch 312b and switch 314b can connect their respective closed position input terminals to their respective output terminals. When Feedback is low, feedback switch 312b and switch 314b may connect their respective open position input terminals to their respective output terminals. The Sample signal can be coupled to sample switches 308b and 310b. When Sample is high, sample switches 308b and 310b can connect their respective closed position input terminals to their respective output terminals. When Sample is low, sample switches 308b and 310b may connect their respective open position input terminals to their respective output terminals. The Sample-P signal can be coupled to sample precharge switch 316b. When Sample-P is high, the closed position input terminal may be connected to the sample precharge switch 316b output terminal. When Sample-P is low, sample precharge switch 316b can be configured in the open position, thus the open position input terminal of sample precharge switch 316b can be connected to the sample precharge switch 316b output terminal.

By viewing FIG. 3B in conjunction with FIG. 2B, the circuit operation can be ascertained. When Sample and Sample-P are both high, during Phase 1, sample precharge switch 316b and sample switches (308b and 310b) may all be in their closed positions. Since Feedback is low at this time, feedback switch 312b and switch 314b can be in their open positions. As such, the input nodes of the capacitive switching circuits (304b and 306b) may both be charged to Vin+ while the charge summing node 318b can be charged to Vref.

When Feedback is high, during Phase 2, feedback switch 312b and switch 314b can be in their closed positions, while all other switches are in their open positions. This can be the state of all switches as actually illustrated in FIG. 3B. During Phase 2, the Vout+ level can be connected through feedback switch 312b and to the input node of the capacitive switching circuit 304b. Also during Phase 2, the input node of the capacitive switching circuit 306b can be connected to ground terminal 328b through switch 314b.

The above described sampling and feedback operations can determine amplifier gain. During the Phase 1 sampling period, capacitive switching circuits 304b and 306b can be connected to the input signal Vin+ through sample switches (308b and 310b), respectively. The sum of their capacitance values, which may be $(a-x-\frac{1}{2})+2x+(\frac{1}{2}+\frac{1}{2})=a+x+\frac{1}{2}$, can be the numerator in the overall gain equation. During the Phase 2 feedback period, capacitive switching circuit 304b can be singly coupled to the actual feedback signal, Vout+, through feedback switch 312b. As such, the denominator in the overall gain equation may be given by the capacitance value of the capacitive switching circuit 304b, which can be $a-x-\frac{1}{2}$. Thus, the overall gain may equal $(a+x+\frac{1}{2})/(a-x-\frac{1}{2})$.

Of course, various described fractional unit capacitors may be formed by connecting multiple unit capacitors in series.

Exponential gain approximation may include additional half steps with the addition of a single unit capacitor to the numerator (sampling capacitors). The even steps can be represented by a gain $(a+x)/(a-x)$ and the odd steps by a gain $(a+x+1)/(a-x)$. Such an approach can obtain twice the number of gain steps with the addition of a single unit capacitor.

Figure 4A:
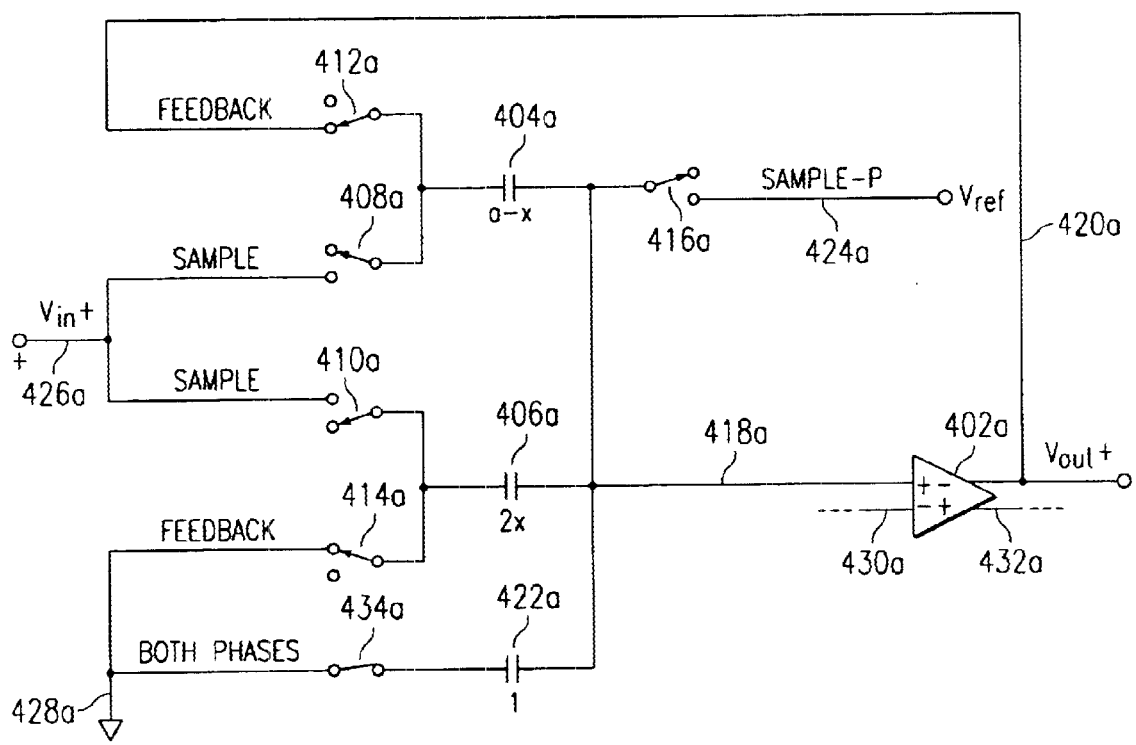
FIG. 4A is a simplified schematic diagram illustrative of a programmable gain amplifier with half the step size, during even steps, for the approximation (a+x)/(a−x).
Figure 4B:
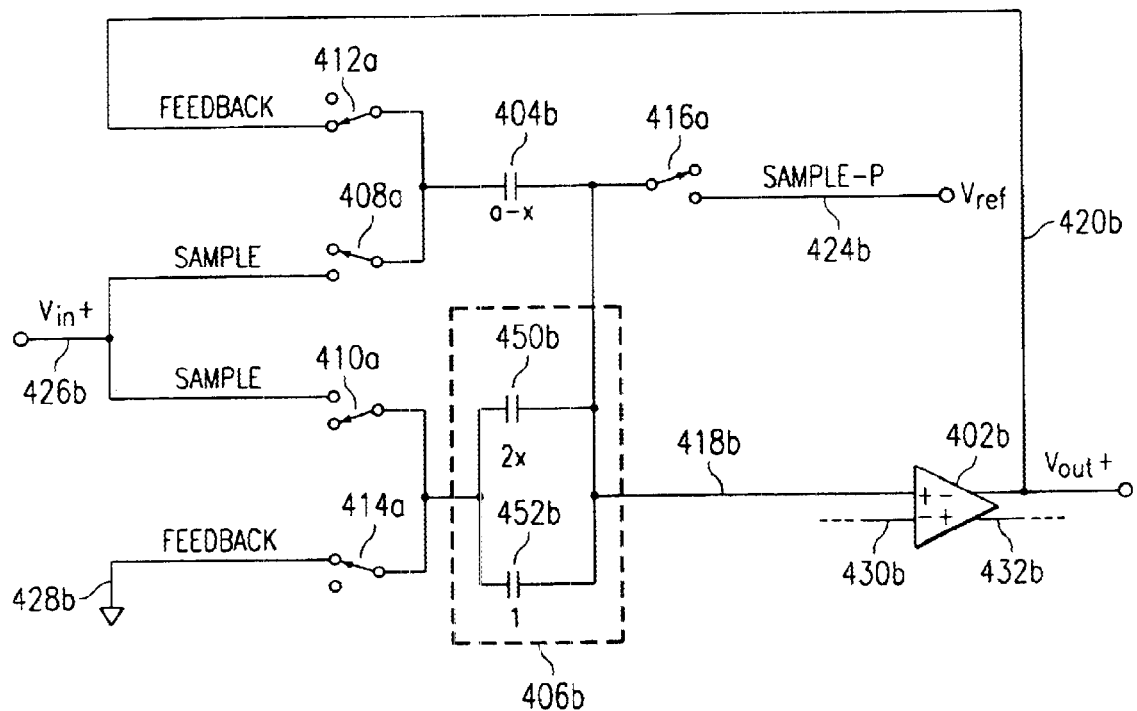
FIG. 4B is a simplified schematic diagram illustrative of a programmable gain amplifier with half the step size, during odd steps, for the approximation (a+x+1)/(a−x).

This approach is shown in FIGS. 4A and 4B. Like the example of FIGS. 3A and 3B, overall gain steps for the programmable gain amplifier may be divided into alternating even and odd steps. A circuit configurations for even steps is shown in FIG. 4A, and can have a gain of $(a+x)/(a-x)$. Odd steps are shown in FIG. 4B, and can have a gain of $(a+x+1)/(a-x)$.

Referring now to FIG. 4A, a schematic diagram of a programmable gain amplifier according to the present invention is set forth. The programmable gain amplifier can include similar constituents as the embodiment set forth in FIG. 3A. To that extent, like constituents will be referred to by the same reference character, but with the first digit being a "4" instead of a "3."

The programmable gain amplifier circuit of FIG. 4A is designated by the general reference character 400a. The programmable gain amplifier circuit 400a of FIG. 4A can be different than the programmable gain amplifier of FIG. 3A in that the first and third capacitive switching circuits (404a and 422a) may have different values. Capacitive switching circuit 404a can be a capacitor that can have the value of $(a-x)$ and capacitive switching circuit 422a can be a capacitor that can have the value of 1.

The sum of the capacitive value of the capacitive switching circuits (404a and 406a), which may be $a-x+2x=a+x$, can be the numerator in the overall gain equation. The denominator in the overall gain equation can be given by the capacitance value of the capacitive switching circuit 404a, which may be $a-x$. Thus, the overall gain for certain gain steps (e.g., even steps) can be $(a+x)/(a-x)$.

Referring now to FIG. 4B, a schematic diagram of a programmable gain amplifier according to the present invention is set forth. The programmable gain amplifier can include similar constituents as the embodiment set forth in FIG. 3B. To that extent, like constituents will be referred to by the same reference character, but with the first digit being a "4" instead of a "3."

The programmable gain amplifier circuit of FIG. 4B is designated by the general reference character 400b. The programmable gain amplifier circuit 400b of FIG. 4B can be different than the programmable gain amplifier of FIG. 3B in that the capacitive switching circuit 404b may have a different value. Capacitive switching circuit 404b can be a capacitor that can have the value of $a-x$.

The sum of the capacitive value of the capacitive switching circuits (404b and 406b), which may be $a-x+2x+1=a+x+1$, can be the numerator in the overall gain equation. The denominator in the overall gain equation can be given by the capacitance value of the capacitive switching circuit 404b, which may be $a-x$. Thus, the overall gain can be $(a+x+1)/(a-x)$.

Figure 5A:
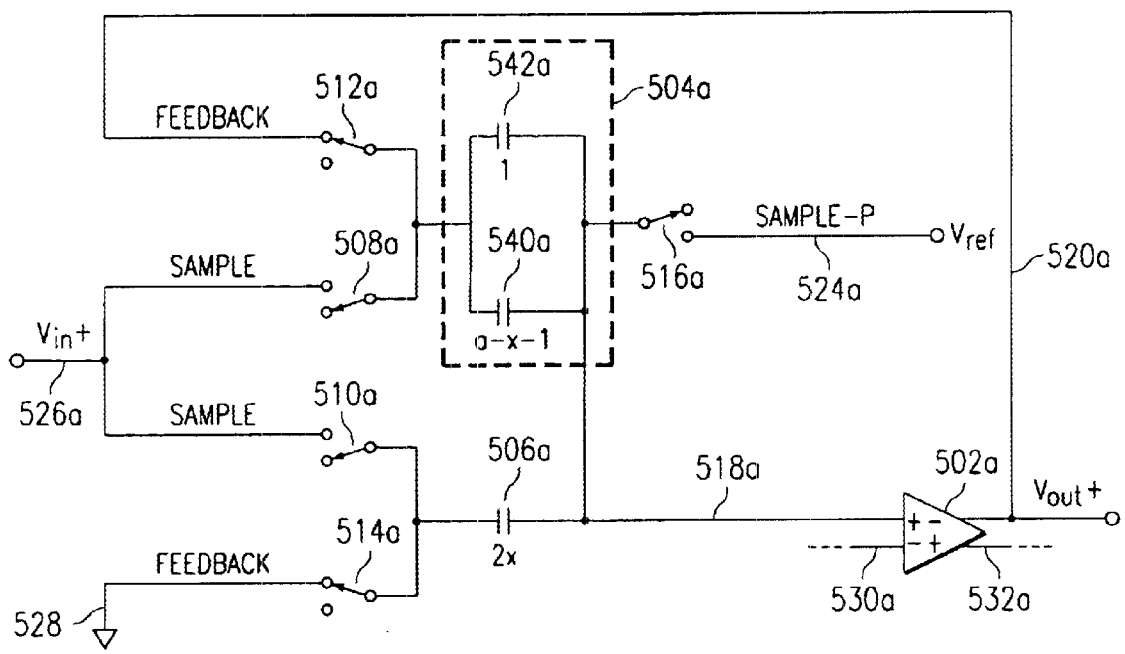
FIG. 5A is a simplified schematic diagram illustrative of a programmable gain amplifier with half the step size, during even steps, for the approximation (a+x)/(a−x).
Figure 5B:
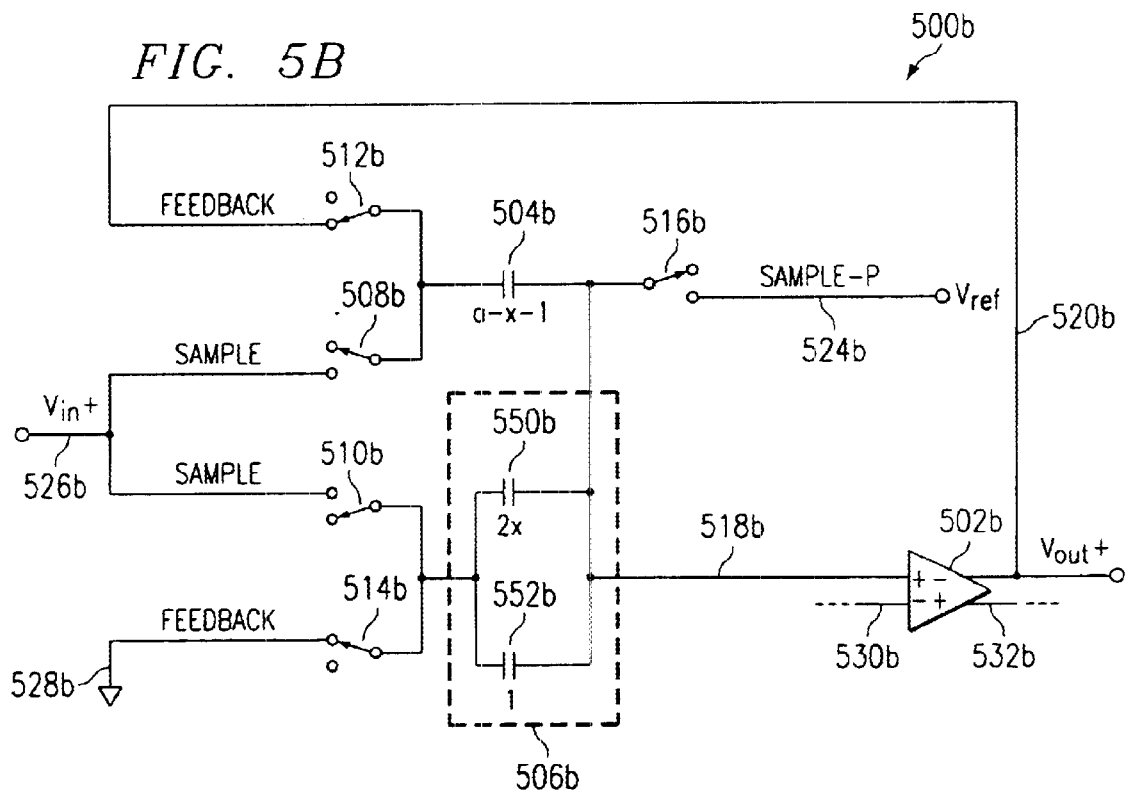
FIG. 5B is a simplified schematic diagram illustrative of a programmable gain amplifier with half the step size, during odd steps, for the approximation (a+x)/(a−x−1).

To provide yet another gain approximations, a third approach is shown in FIGS. 5A and 5B. Like the example of FIGS. 3A and 3B, overall gain steps for the programmable gain amplifier may be divided into alternating even and odd steps. A circuit configurations for even steps is shown in FIG. 5A, and can have a gain of $(a+x)/(a-x)$. A circuit configuration for odd steps is shown in FIG. 5B, and can have a gain of $(a+x)/(a-x-1)$.

Referring now to FIG. 5A, a schematic diagram of a programmable gain amplifier according to the present invention is set forth. The programmable gain amplifier can include similar constituents as the embodiment set forth in FIG. 3A. To that extent, lke constituents will be referred to by the same reference character, but with he first digit being a "5" instead of a "3."

The programmable gain amplifier circuit of FIG. 5A is designated by the general reference character 500a. The programmable gain amplifier circuit 500a of FIG. 5A can be different than the programmable gain amplifier of FIG. 3A in that the capacitive switching circuit 504a can include capacitor circuits 540a and 542a that can have different values than the embodiment in FIG. 3A. Capacitor circuit 540a can be a capacitor that can have the value of $(a-x-1)$ and capacitor circuit 542a can be a capacitor that has the value of 1. Also, the programmable gain amplifier circuit 500a may not have a third capacitive switching circuit.

The sum of the capacitive value of the capacitive switching circuits (504a and 506a), which may be $a-x-1+2x+1=a+x$, can be the numerator in the overall gain equation. The denominator in the overall gain equation can be given by the capacitance value of the capacitive switching circuit 504a, which may be $a-x-1+1=a-x$. Thus, the overall gain can be $(a+x)/(a-x)$.

Referring now to FIG. 5B, a schematic diagram of a programmable gain amplifier according to the present invention is set forth. The programmable gain amplifier can include similar constituents as the embodiment set forth in FIG. 3B. To that extent, like constituents will be referred to by the same reference character, but with the first digit being a "5" instead of a "3."

The programmable gain amplifier circuit of FIG. 5B is designated by the general reference character 500b. The programmable gain amplifier circuit 500b of FIG. 5B can be different than the programmable gain amplifier of FIG. 3B in that the capacitive switching circuit 504b can have a different value. Capacitive switching circuit 504b can be a capacitor that can have the value of a−x−1.

The sum of the capacitive value of the capacitive switching circuits (504b and 506b), which may be a−x−1+2x+1=a+x, can be the numerator in the overall gain equation. The denominator in the overall gain equation can be given by the capacitance value of the capacitive switching circuit 504b, which may be a−x−1. Thus, the overall gain can be (a+x)/(a−x−1).

While the embodiment illustrated in FIGS. 4A, 4B, 5A, and 5B can provide an approximate programmable exponential gain, there may be some variation in step size. More particularly, for the case of a gain range of 1 to 2, with 128 steps, a deviation in step size can be as much as 0.016 dB at the maximum gain setting.

Figure 6:
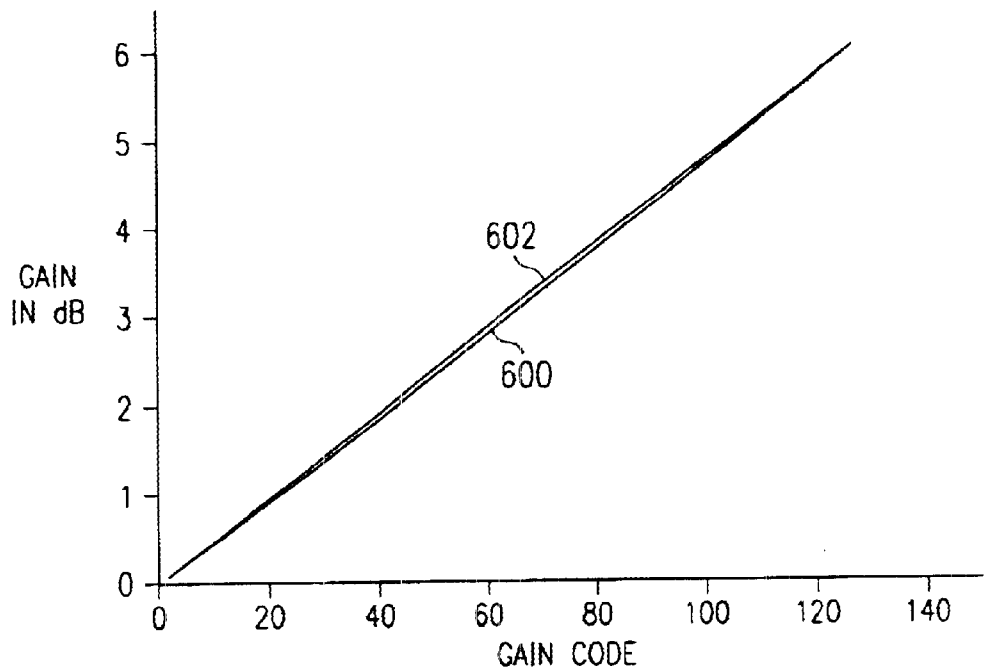
FIG. 6 is a diagram illustrative of the variation in gain obtained by embodiments of the present invention along with the associated ideal characteristics.

Comparison of the characteristics of the three extensions discussed above to the existing scheme, as well as an ideal characteristic, is shown in FIG. 6 in curves 600 and 602. Curve 600 can be the ideal characteristic and curve 602 can show the three extentions of (a+x)/(a−x), (a+x)/(a−x−1), and (a+x+1)/(a−x).

Figure 7:
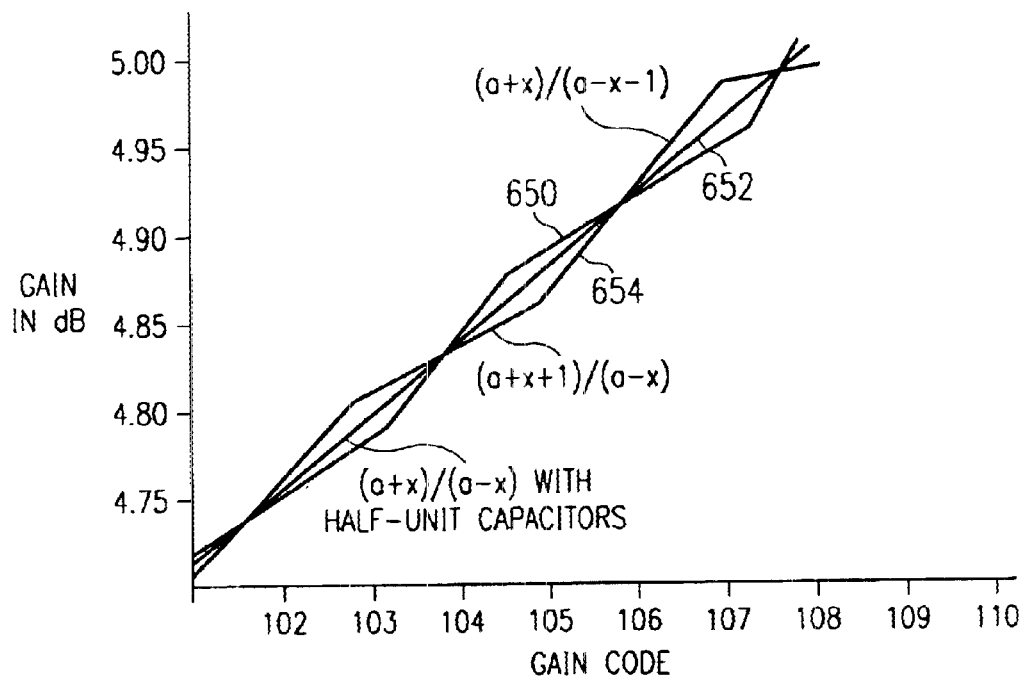
FIG. 7 is a diagram illustrative of the differences in the characteristics of the first, second, and third embodiments of the present invention.
Figure 8:
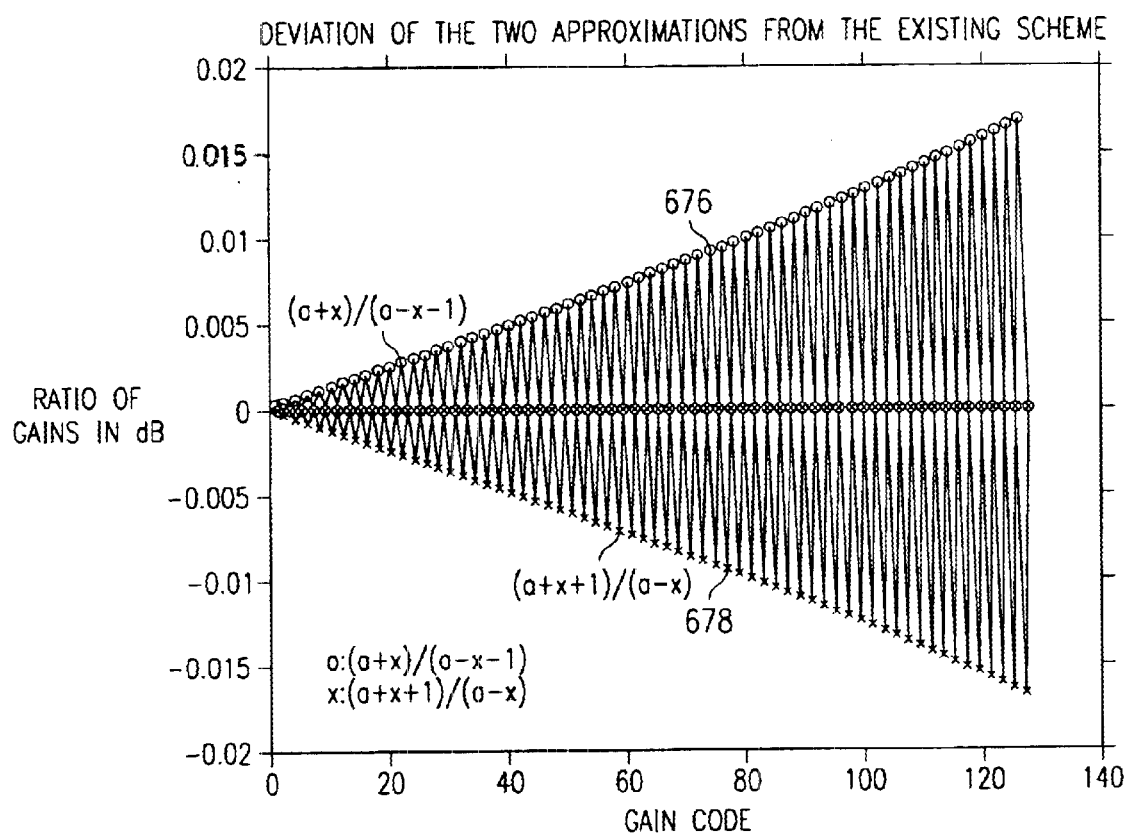
FIG. 8 is a diagram illustrative of the differences in the characteristics of embodiments of the present invention, as ratios of gains.

The comparison of the three cases near the high gain end (from curve 600 of FIG. 6) can be shown in FIG. 7. Curve 650 is an illustratation of the (a+x)/(a−x−1) case, curve 652 shows the (a+x)/(a−x) case with half-unit capacitors, and curve 654 illustrates the (a+x+1)/(a−x) case. The deviation of the approximations from the existing (a+x)/(a−x) scheme is indicated in FIG. 8 with the (a+x)/(a−x−1) data points labeled 676 and symbolized as circles, and the (a+x+1)/(a−x) data points labeled 678 and symbolized as "X" characters.

The above examples illustrate particular embodiments in which a programmable gain may include a number of gain steps having different sampling and/or feedback capacitance for alternating gain steps. However, different embodiments may include different sampling and/or feedback capacitance for sets of consecutive gain steps. Particular examples of such embodiments will be described below.

It is noted that while particular logarithmic approximations have been shown above, other approximations can be utilized to reduce the number of unit capacitors. For example, consider the case of doubling the gain range from 1 to 2 to a gain range of 1 to 4, utilizing 64 steps in each case. The current algorithm of (a+x)/(a−x)=4, solving for 'a' and plugging the result in a+x, can require 170 unit capacitors, but has a maximum deviation of 0.7 dB from the ideal. To reduce this deviation, the same algorithm can be used piecewise for a gain range of 1 to 2 as (a+x)/(a−x) and then a new algorithm, 2(a+x)/(a−x), may be used for a gain range of 2 to 4.

While the above approach may have less deviation from the ideal than cases employing one approximation for an entire gain range, 256 unit capacitors may be necessary. Alternatively, gain deviation may slightly increased in order to reduce overall unit capacitors. For example, a relationship (a+x)/(a−x) may be used for a gain range of 1 to 2. A second approximation 2a/(a−x) may then be used for a gain range of 2 to 4. This may require only 128 unit capacitors and may have a maximum deviation of 0.5 dB from the ideal.

Figure 9:
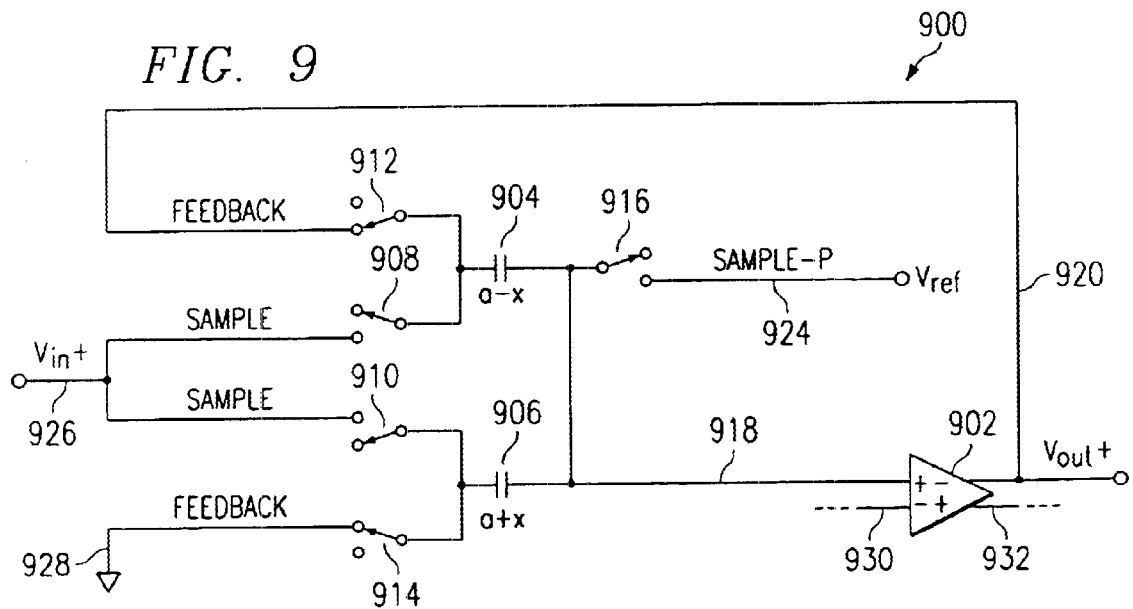
FIG. 9 is a simplified schematic diagram illustrative of a programmable gain amplifier implementing the function (2a)/(a−x).

In some applications, a programmable gain amplifier may include coarse gain segments that each spanned by the fine gain steps. The above approach can be utilized in such an application. As but one example, a last segment can utilize the above relationship for a gain range of 2 to 4. Preceding segment(s), however, can utilize the relationship for a gain range of 1 to 2 giving a close approximation to the required characteristics. It is noted that a function 2a/(a−x) can be implemented as 1+((a+x)/(a−x)). A programmable gain amplifier configuration for generating such a relationship is illustrated in FIG. 9. It is understood that a configuration for generating the relationship (a+x)/(a−x) was previously described.

Referring now to FIG. 9, a schematic diagram of a programmable gain amplifier according to the present invention is set forth. The programmable gain amplifier can include similar constituents as the embodiment set forth in FIG. 2A. To that extent, lke constituents will be referred to by the same reference character, but with he first digit being a "9" instead of a "2."

The programmable gain amplifier circuit of FIG. 9 is designated by the general reference character 900. The programmable gain amplifier circuit 900 of FIG. 9 is different than the programmable gain amplifier of FIG. 2 in that the capacitive switching circuit 906 has a different value than the embodiment in FIG. 2. Capacitor circuit 906 is capacitor that has the value of (a+x).

The sum of the capacitive value of the capacitive switching circuits (904 and 906), which may be (a−x)+(a+x)=2a, can be the numerator in the overall gain equation. The denominator in the overall gain equation can be given by the capacitance value of capacitive switching circuit 904, which may be a−x. Thus, the overall gain can be (2a)/(a−x).

While a particular pair of algorithms have been described for different gain ranges, such algorithms should be not construed as limiting the invention thereto. It is understood that algorithms other than those described may be used to approximate particular gain ranges. As but one example, to approximate a gain range of 1 to 4, the relationship (2a+x)/(a−x) may be used. Such a function can make use of the negative x-region of the approximation. At minimum value of x (negative), the gain can be 1 and when x=0, the gain can be 2. Above a gain of 2 it can become nonlinear, and thus a different approximation may be used for such higher gains. One particular programmable gain amplifier configuration for implementing the relationship (2a+x)/(a−x) is illustrated in FIG. 10.

Referring now to FIG. 10, a schematic diagram of a programmable gain amplifier according to the present invention is set forth. The programmable gain amplifier can include similar constituents as the embodiment set forth in FIG. 2A. To that extent, lke constituents will be referred to by the same reference character, but with the first digit being a "10" instead of a "2."

The programmable gain amplifier circuit of FIG. 10 is designated by the general reference character 1000. The programmable gain amplifier circuit 1000 of FIG. 10 can be different than the programmable gain amplifier of FIG. 2A in that the capacitive switching circuit 1006 can have a different value than the embodiment in FIG. 2A. Capacitor circuit 1006 can be a capacitor that can have the value of a+2x.

The sum of the capacitive value of the capacitive switching circuits (1004 and 1006), which may be (a−x)+(a+2x)=2a+x, can be the numerator in the overall gain equation. The denominator in the overall gain equation can be given by the capacitance value of the first capacitive switching circuit 1004, which may be a−x. Thus, the overall gain can be (2a+x)/(a−x).

The above embodiments have shown cases where a capacitor circuit that includes a feedback capacitance can vary in order to to achieve approximate logarithmic gain characteristics. In cases, a fixed feedback capacitance may be desirable. One way to achieve desired gains with a fixed feedback capacitance may be with the approximation $\log_e(1+x) = \sim x$, $|x| < 1$. As in the previous cases, such a relationship may be realized by switched-capacitor circuits. As an example, the gain range 1 to 2 can be spanned in 64 steps by the function $1+(x/c)$ using 128 capacitors, with $c=64$. One example of such an implementation is illustrated in FIG. 11.

Referring now to FIG. 11, a schematic diagram of a programmable gain amplifier according to the present invention is set forth. The programmable gain amplifier can include similar constituents as the programmable gain amplifier set forth in FIG. 2A. To that extent, like constituents will be referred to by the same reference character, but with he first digit being an "11" instead of a "2."

The programmable gain amplifier circuit of FIG. 11 is designated by the general reference character 1100. The programmable gain amplifier circuit 1100 of FIG. 11 can be different than the programmable gain amplifier of FIG. 2A in that capacitive switching circuits 1104 and 1106 can have different values than the embodiment in FIG. 2A. Capacitor circuit 1106 can have the value of c. Capacitor circuit 1104 can have the value c.

The sum of the capacitive value of capacitive switching circuits (1104 and 1106), which may be c+x, can be the numerator in the overall gain equation. The denominator in the overall gain equation can be given by the capacitance value of capacitive switching circuit 1104, which may be x. Thus, the overall gain can be (c+x)/(c), or 1+x/c.

Having described approaches to providing programmable gains, and particular circuit configurations for implementing such gains, the gain characteristics for the described approaches will now be discussed.

Various characteristics of the above gain systems are illustrated in FIG. 12A, FIG. 12B, FIG. 12C, FIG. 12D, and FIG. 12E.

Figure 12A:
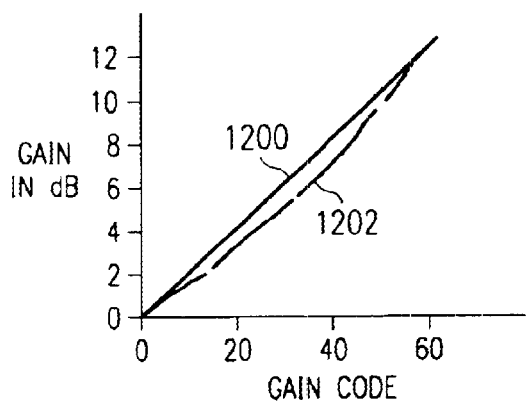
FIG. 12A is a diagram illustrative of the characteristics of the function (a+x)/(a−x).

FIG. 12A shows the (a+x)/(a−x) function characteristics, where a=106, versus an ideal exponential characteristic. In such an approach, 170 unity capacitors are used for the sample and feedback stages to approximate gains of 1 to 4. Curve 1200 represents the ideal exponential case and curve 1202 represents the approximation case. In the approximation the maximum deviation from the ideal can be 0.67 dB. FIG. 12A thus represents a conventional approach in which a single relationship is used for all gain steps.

Figure 12B:
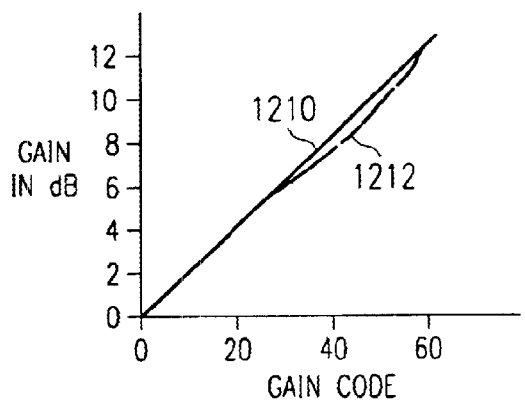
FIG. 12B is a diagram illustrative of the characteristics of the two segment functions (a+x)/(a−x) and (2a)/(a−x).

FIG. 12B shows the above-described approach of one embodiment, in which a total gain range may be subdivided into gain segments. Each gain segment includes gain steps governed by a different approximation. In particular, a two segment solution is shown. The (a+x)/(a−x) function characteristics, where a=64, are shown in the 0 to 6 dB range. From 6 to 12 dB, the 2a/(a−x) function characteristics, where a=64, is shown. Curve 1210 represents the ideal exponential case and curve 1212 represents the approximation case whereby the maximum deviation from the ideal is 0.48 dB.

Figure 12C:
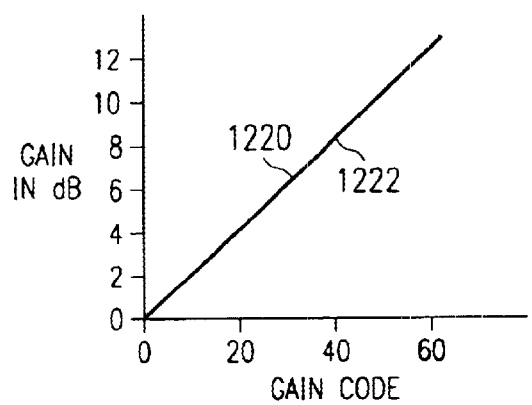
FIG. 12C is a diagram illustrative of the characteristics of the two segment functions (a+x)/(a−x) and 2(a+x)/(a−x).

FIG. 12C shows yet another example in which a total gain range may be subdivided into gain segments. Again, each gain segment can include a number of gain steps governed by different relationships. In particular, for a gain range of 0 to 6 dB, a relationship (a+x)/(a−x) may be employed. However, for a gain range of 6 to 12 dB, a relationship of 2(a+x)/(a−x) may be used. Curve 1220 represents the ideal exponential case and curve 1222 represents the approximation case whereby the maximum deviation from the ideal is 0.08 dB.

Figure 12D:
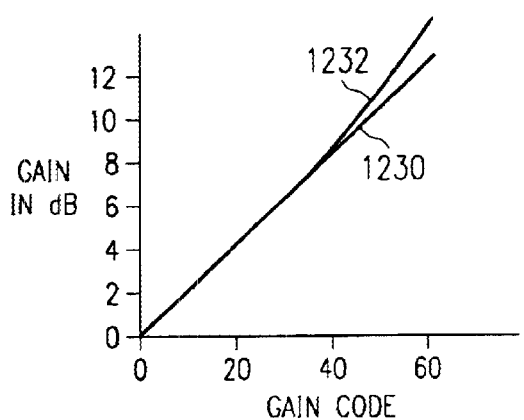
FIG. 12D is a diagram illustrative of the characteristics of the function (2a+x)/(a−x).

In FIG. 12D, the 1+(a+2x)/(a−x)=(2a+x)/(a−x) function characteristics, where a=64, are shown for the 0–12 db range. Curve 1230 represents the ideal exponential case and curve 1232 represents the approximation case whereby the maximum deviation from the ideal in the 0–6 dB range is 0.26 dB. It becomes non-linear in the 6 to 12 dB range with a maximum deviation of 1.66 dB. Thus, a relationship such as that shown in FIG. 12D may be used for a one range (0–6 dB), while another relationship may be used for higher gain ranges.

Figure 12E:
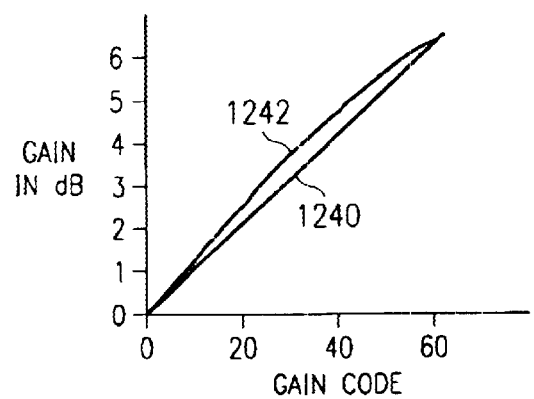
FIG. 12E is a diagram illustrative of the characteristics of the function 1+(x/c).

In FIG. 12E, the 1+(x/c) function characteristics, where c=64, in the 0 to 6 dB range are shown. Curve 1240 represents the ideal case and curve 1242 represents the approximation case whereby the maximum deviation from the ideal is 0.52 dB.

The above embodiments have shown approaches to configuring programmable gain amplifiers that may reduce the number of capacitors required to provide a given number of gain steps, or a particular gain range. Reducing capacitors can lead to a reduction in power consumption, or faster circuit operation, or reductions in circuit area. Such improvements may be a significant advantage over existing methods.

The above embodiments have shown approaches to obtaining exponential gain variations with a linearly varying input code. However, such embodiments are illustrative of the principles of the present invention and are not intended to limit the invention to the particular embodiments described. For example, those skilled in the art, in light of this disclosure, can implement, without undue experimentation, other embodiments of this method that are different from those described, but achieve the same or an equivalent function. Accordingly, while the preferred embodiment of the invention has been illustrated and described, it will be appreciated that various changes can be made therein without departing from the spirit and scope of the invention.

What is claimed is:

1. A programmable gain amplifier having at least n gain steps, comprising:

an amplifier having at least one amplifier input;

a plurality of switches that couple a sample voltage to an input node for a first time period and a feedback voltage to the input node for a second time period; and at least one capacitor circuit coupled to the input node that includes a plurality of unit capacitors that provide a first capacitance for a first group of the n gain steps and a second capacitance for a second group of the n gain steps, wherein the n gain steps include alternating even and odd gain steps, and the first group of steps includes the even steps and the second group of steps includes the odd steps.

2. The programmable gain amplifier of claim 1, wherein:

the first group of steps includes a set of consecutive steps over a first gain range and the second group of steps includes a set of consecutive steps over a second gain range that is different than the first gain range.

3. The programmable gain amplifier of claim 3, wherein:

the first gain range is approximately 1 to 2 and the second second gain range is approximately 2 to 4.

4. The programmable gain amplifier of claim 1, wherein:

the at least one capacitor circuit includes a first capacitor circuit having a first node coupled to the sample voltage in the first time period and coupled to the feedback voltage in the second time period by the plurality of switches, and a second node coupled to the at least one amplfier input; and a second capacitor circuit having a third node coupled to the sample voltage in the first time period by the plurality of switches and a fourth node coupled to the at least one amplfier input.

5. The programmable gain amplifier of claim 4, wherein:

the first capacitor circuit includes a first configuration that includes a predetermined number of unit capacitors each having a unit capacitance, and a second configuration having the predetermined number of unit capacitors in parallel with no more than a single unit capacitance, the first capacitance being included in the first configuration the second capacitance being included the second configuration.

6. The programmable gain amplifier of claim 4, wherein:

the no more than a single unit capacitance is selected from the group consisting of a unit capacitance, a ½ unit capacitance, and ¼ unit capacitance.

7. The programmable gain amplifier of claim 4, wherein:

the second capacitor circuit includes a first configuration having a predetermined number of unit capacitors each having a unit capacitance, and a second configuration having the predetermined number of unit capacitors in parallel with no more than a single unit capacitance, the first capacitance being included in the first configuration the second capacitance being included the second configuration.

8. The programmable gain amplifier of claim 7, wherein:

the no more than a single unit capacitance is selected from the group consisting of a unit capacitance, a ½ unit capacitance, and a ¼ unit capacitance.

9. The programmable gain amplifier of claim 4, wherein:

the first capacitor circuit includes at least a first capacitor circuit portion disposed between the first node and the at least one input having a capacitance equivalent to z unit capacitors, where z is selected from the group consisting of a−x−½, a−x, and a−x−1, where a and x are integers, a>x, and x is a programmable value.

10. The programmable gain amplifier of claim 4, wherein:

the second capacitor circuit includes at least a second capacitor circuit portion disposed between the third node and the at least one input having a capacitance equivalent to z unit capacitors, where z is selected from the group consisting of 2x, a+x, a+2x, 2x+1 and x, where a and x are integers, and a>x, and x is a programmable value.

11. A programmable gain amplifier having n gain steps where the n steps, comprising:

an operational amplifier;

analog input terminals;

a charge summing node;

an array of programmable capacitors programmed to give a first capacitive switching circuit and a second capacitive switch circuit for each of the n steps;

a first analog output terminal outputting an analog output voltage;

a first sampling switch coupled to charge the first capacitive switching circuit according to the voltage on the first analog input terminal;

a first feedback switch coupled to charge the first capacitive switching circuit according to the voltage on the first analog output terminal; and a second feedback switch coupled to charge the second capacitive circuit to a predetermined voltage; wherein the first group of steps are each governed by a first gain equation, which determines the capacitance of the first and second capacitance switching circuits, and the second group of steps is governed by a second gain equation, which determines the capacitance of the first and second capacitance switching circuits, the first gain equation being different than the second gain equation.

12. The programmable gain amplifier of claim 11, wherein:

the first group of steps are sequential and are followed by second group of steps which are sequential.

13. The programmable amplifier claim of 11, wherein:

a is a predetermined value of capacitance and x is a programmable capacitance value determined by the $n^{th}$ gain step, and the second group of steps has the first capacitive switching circuit with a capacitance selected from the group consisting of (a−x), (a−x−f) and the second group of steps has the second capacitive switching circuit with the value selected from the group consisting of (a+x), (2x), (2x+1), and (a+2x), where a and x are at least one and f is no more than one.

14. The programmable amplifier claim of 13, wherein:

f is fraction $½^k$, where k is an integer greater than or equal to 0.

15. The programmable gain amplifier of claim 11, wherein:

in one of the gain steps, at least one capacitor, from the array of programmable capacitors is not used in the first capacitive switching circuit and the second capacitive switching circuit and is coupled between the charge summing node and a reference voltage.

16. The programmable gain amplifier of claim 11, wherein:

the array of programmable capacitors includes a plurality of capacitors having the same value of capacitance.

17. The programmable gain amplifier of claim 15, wherein:

the array of programmable capacitors further includes at least one fractional capacitor that is a configured having a value that is a fraction of the capacitance of each same sized capacitors.

18. The programmable gain amplifier of claim 11, wherein:

the first group of steps alternate with the second group of steps.

19. A programmable gain amplifier having n gain steps, with n being an integer, the programmable gain amplifier comprising:

an operational amplifier having a first op amp input and a first op amp output;

a first analog input terminal receiving a differential analog input voltage;

a charge summing node coupled to the first analog input terminal;

an array of programmable capacitors, for each step the array of programmable capacitors are programmed to give a first capacitive switching circuit and a second capacitive switching circuit;

a first analog output terminal coupled to the first op amp output and outputting an analog output voltage;

a first sampling switch coupled to charge the first capacitive switching circuit according to the voltage on the first analog input terminal, and a first feedback switch circuitry coupled to charge the first capacitive switching circuit according to the voltage on the first analog output terminal whereby the first charge summing node is coupled to receive this charge; and a precharge switch coupled to charge the second capacitive circuit to a voltage reference level whereby the first charge summing node is coupled to receive this charge whereby 'a' is a predetermined value of capacitance and 'x' is a programmable capacitance value determined by the gain step and the first capacitive switching circuit has an approximate value of (a−x) and the second capacitive switching circuit has an approximate value of (a+2x).

20. The programmable gain amplifier of claim 19, wherein the first capacitive switching circuit has an approximate value of 'a' and the second capacitive switching circuit has an approximate value of 'x.'

* * * * *